(12) United States Patent
Tian et al.

(10) Patent No.: US 12,129,752 B1
(45) Date of Patent: Oct. 29, 2024

(54) PRECISE DEEP OIL AND GAS NAVIGATION SYSTEM BASED ON STRUCTURAL EVALUATION OF SAND/SHALE FORMATION, AND DEVICE

(71) Applicant: INSTITUTE OF GEOLOGY AND GEOPHYSICS, CHINESE ACADEMY OF SCIENCES, Beijing (CN)

(72) Inventors: Fei Tian, Beijing (CN); Wenhao Zheng, Beijing (CN); Qingyun Di, Beijing (CN); Yongyou Yang, Beijing (CN); Wenjing Cao, Beijing (CN)

(73) Assignee: INSTITUTE OF GEOLOGY AND GEOPHYSICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 18/434,846

(22) Filed: Feb. 7, 2024

(30) Foreign Application Priority Data

Sep. 19, 2023 (CN) .......................... 202311205154.X

(51) Int. Cl.
*E21B 44/00* (2006.01)
*E21B 49/00* (2006.01)
(Continued)

(52) U.S. Cl.
CPC .............. *E21B 44/00* (2013.01); *E21B 49/00* (2013.01); *G01V 11/002* (2013.01); *E21B 2200/20* (2020.05); *G06F 30/28* (2020.01)

(58) Field of Classification Search
CPC ...... E21B 44/00; E21B 49/00; E21B 2200/20; G01V 11/002; G06F 30/28
(Continued)

(56) References Cited

U.S. PATENT DOCUMENTS

| | | | |
|---|---|---|---|
| 11,500,117 | B1 | 11/2022 | Tian et al. |
| 2016/0341834 | A1 | 11/2016 | Bartetzko et al. |
| 2023/0333274 | A1* | 10/2023 | Tian .................. G01V 1/36 |

FOREIGN PATENT DOCUMENTS

| | | |
|---|---|---|
| CN | 112529341 A | 3/2021 |
| CN | 114463333 A | 5/2022 |

(Continued)

OTHER PUBLICATIONS

English translation of CN116957364, Nov. 24, 2023. (Year: 2023).*

(Continued)

*Primary Examiner* — Michael P Nghiem
(74) *Attorney, Agent, or Firm* — Bayramoglu Law Offices LLC

(57) ABSTRACT

A precise deep oil and gas navigation system based on structural evaluation of a sand/shale formation, and a device are provided. The precise deep oil and gas navigation system is implemented by: acquiring basic data of a target well location as well as basic data and an acoustic LWD curve of an adjacent well; dividing a basic data group; retaining extremely strongly correlated data and strongly correlated data of the basic data group, and performing dimensionality reduction; constructing a three-dimensional fusion feature data volume based on a dimensionality-reduced fusion feature parameter and a time-frequency spectrum; predicting a missing curve according to the three-dimensional fusion feature data volume; and correcting a stratigraphic structure model based on the missing curve to guide the design of a drilling trajectory.

7 Claims, 6 Drawing Sheets

(51) Int. Cl.
*G01V 11/00* (2006.01)
*G06F 30/28* (2020.01)

(58) Field of Classification Search
USPC .............................................. 702/9
See application file for complete search history.

(56) References Cited

FOREIGN PATENT DOCUMENTS

| CN | 116957364 B | * | 11/2023 |
| CN | 117150929 A | * | 12/2023 |
| CN | 117386356 A | * | 1/2024 |

OTHER PUBLICATIONS

English translation of CN 117386356, Jan. 12, 2024. (Year: 2024).*
English translation of CN 117150929, Dec. 1, 2023. (Year: 2023).*
Wang Qinghai, et al., Analysis and Correction of Anomalies in Acoustic Logging Data of Steeply Inclined Impedance Surface, Subgrade Engineering, 2023, pp. 90-95.

* cited by examiner

```
┌─────────────────────────────────────────────────────────────────┐
│ Acquire basic data of a target well location as well as basic  │
│ data and an acoustic LWD curve of an adjacent well, and divide │
│ the basic data of the target well location and the basic data │
│ of the adjacent well into lithological group data, electrical  │
│ group data, porosity group data, drilling group data,          │
│ and logging group data                                          │
└─────────────────────────────────────────────────────────────────┘
                                │
                                ▼
┌─────────────────────────────────────────────────────────────────┐
│ Generate, by a data processing device, a drilling trajectory   │
│ of the target well location based on the basic data and the    │
│ acoustic LWD curve of the adjacent well                        │
└─────────────────────────────────────────────────────────────────┘
                                │
                                ▼
┌─────────────────────────────────────────────────────────────────┐
│ Calculate a first correlation value between each type of the   │
│ basic data of the adjacent well and the acoustic LWD curve     │
│ thereof, and eliminate a data type with the first correlation  │
│ value lower than a preset first correlation threshold from the │
│ basic data of the target well location to acquire z            │
│ non-redundant basic data groups                                 │
└─────────────────────────────────────────────────────────────────┘
                                │
                                ▼
┌─────────────────────────────────────────────────────────────────┐
│ Perform dimensionality reduction on each of the non-redundant  │
│ basic data groups to acquire z fusion feature parameters       │
└─────────────────────────────────────────────────────────────────┘
                                │
                                ▼
┌─────────────────────────────────────────────────────────────────┐
│ Select fusion feature parameters of the lithological group     │
│ data based on the basic data of the target well location,      │
│ perform geological stratification to acquire a time-frequency  │
│ spectrum of logging data, and convert the z fusion feature     │
│ parameters into a three-dimensional fusion feature data volume │
│ based on the time-frequency spectrum of the logging data       │
└─────────────────────────────────────────────────────────────────┘
                                │
                                ▼
┌─────────────────────────────────────────────────────────────────┐
│ Acquire a predicted acoustic LWD curve based on the            │
│ three-dimensional fusion feature data volume through a trained │
│ missing curve prediction model                                  │
└─────────────────────────────────────────────────────────────────┘
                                │
                                ▼
┌─────────────────────────────────────────────────────────────────┐
│ Acquire an initial stratigraphic structure model based on the  │
│ basic data and the acoustic LWD curve of the adjacent well,    │
│ and correct the initial stratigraphic structure model based on │
│ the predicted acoustic LWD curve to acquire a stratigraphic    │
│ structure model                                                 │
└─────────────────────────────────────────────────────────────────┘
                                │
                                ▼
┌─────────────────────────────────────────────────────────────────┐
│ Generate, by the data processing device, a new drilling        │
│ trajectory based on the stratigraphic structure model and the  │
│ drilling trajectory of the target well location                │
└─────────────────────────────────────────────────────────────────┘
```

FIG. 1

PRECISE DEEP OIL AND GAS NAVIGATION SYSTEM BASED ON STRUCTURAL EVALUATION OF SAND/SHALE FORMATION, AND DEVICE

CROSS-REFERENCE TO THE RELATED APPLICATIONS

This application is based upon and claims priority to Chinese Patent Application No. 202311205154.X, filed on Sep. 19, 2023, the entire contents of which are incorporated herein by reference.

TECHNICAL FIELD

The present disclosure belongs to the field of deep underground navigation, and in particular relates to a precise deep oil and gas navigation system based on structural evaluation of a sand/shale formation, and a device.

BACKGROUND

Drilling oil and gas wells is a complex process that involves many operational factors and significant geological uncertainties. Understanding the geological environment is crucial for placing wells in optimal positions in hard-rock drilling and geo-steering applications. The use of measurement while drilling (MWD) and logging while drilling (LWD) data for advanced analysis is a method used for gaining a deep understanding of mechanical properties of the rock surrounding the drill bit. Acoustic LWD is commonly used to estimate the mechanical properties of rocks, which can be combined with seismic data to greatly reduce the ambiguity of geological interpretation, thereby constructing accurate oil and gas reservoir models. However, due to cost constraints or wellbore issues, acoustic LWD data may be missing or have reduced reliability in certain wells in the target area (Wang Qinghai; Zhao Fuyu; Zhong xingxing. *Analysis and Correction of Anomalies in Acoustic LWD Data of Steeply Inclined Impedance Surface* [J]. Subgrade Engineering, 2023(02):90-95.DOI:10.13379/j.issn.1003-8825.202210012). Therefore, estimation must be based on other common logging types.

Fundamentally, predicting missing logging data through mathematical methods is a challenging task. Predicting missing logging data at a specific depth based on other logging types measured at the same depth implicitly assumes that the measured logging type includes sufficient reconstruction information. However, this dependency relationship between the missing logging type and the measured logging type may not exist, either partially or completely. In practice, it is often assumed that the designed and measured logging types are complementary, so as to provide geoscientists with multi-dimensional views of the underground, or to effectively provide a more complete characterization of the underground. However, if it is assumed that there is a certain dependency relationship between these logging types, attempts to establish the relationship based solely on local analysis may be limited.

SUMMARY

To solve the above-mentioned problem existing in the prior art, that is, in the missing curve prediction method in the prior art, the local data-based estimation is not reliable due to a change in the geological depth, the present disclosure provides a precise deep oil and gas navigation system based on structural evaluation of a sand/shale formation.

The precise deep oil and gas navigation system is implemented through a drilling equipment group, where the drilling equipment group includes a drill bit, a drill bit positioning device, a drill rod, a lithological data acquisition device, an electrical data acquisition device, a porosity data acquisition device, a drilling data acquisition device, a logging data acquisition device, an acoustic logging while drilling (LWD) acquisition device, a data transmission device, and a data processing device; and the precise deep oil and gas navigation system includes: a data acquisition module, an initial trajectory generation module, an interference elimination module, a data dimensionality reduction module, a fusion feature data volume construction module, a missing curve prediction module, a stratigraphic structure model correction module, and a trajectory adjustment module;

the data acquisition module is configured to acquire basic data of a target well location as well as basic data and an acoustic LWD curve of an adjacent well through a logging device, and divide the basic data of the target well location and the basic data of the adjacent well into lithological group data, electrical group data, porosity group data, drilling group data, and logging group data through the data processing device, where the lithological group data includes: neutron logging (NEU), photoelectric factor (PEF), and gamma ray (GR); the electrical group data includes: deep investigate double lateral resistivity log (RD), shallow investigate double lateral resistivity log (RS), and induction conductivity (COND); the porosity group data includes: borehole diameter (CAL), compensated neutron log (CNL), and density (DEN); the drilling group data includes drilling rate, rotary speed, and bit pressure; and the logging group data includes C1C2, mud density in all (MDIA), and formation pore pressure graduation (FPPG);

the lithological data acquisition device, the electrical data acquisition device, the porosity data acquisition device, the drilling data acquisition device, and the logging data acquisition device are configured to acquire the basic data of the adjacent well; the acoustic LWD acquisition device is configured to acquire the acoustic LWD curve of the adjacent well, and upload the acoustic LWD curve to the data processing device through the data transmission device in the drill rod; and the data transmission device includes an optical fiber and a data cable for wire or wireless communication;

the initial trajectory generation module is configured to generate a drilling trajectory of the target well location based on the basic data and the acoustic LWD curve of the adjacent well through the data processing device, and transmit the drilling trajectory to the drill bit through the data transmission device;

the drill bit is configured to drill according to the drilling trajectory, acquire the basic data of the target well location in real time through the following lithological data acquisition device, electrical data acquisition device, porosity data acquisition device, and drilling data acquisition device, and upload the basic data to the data processing device through the data transmission device in the drill rod;

the interference elimination module is configured to calculate a first correlation value between each type of the basic data of the adjacent well and the acoustic LWD curve thereof, and eliminate a data type with the first correlation value lower than a preset first correlation threshold from the basic data of the target well location to acquire z non-redundant basic data groups, where z denotes an integer from 1 to 5;

the data dimensionality reduction module is configured to perform dimensionality reduction on each of the non-redundant basic data groups to acquire z fusion feature parameters;

the fusion feature data volume construction module is configured to select fusion feature parameters of the lithological group data based on the basic data of the target well location, perform geological stratification to acquire a time-frequency spectrum of logging data, and convert the z fusion feature parameters into a three-dimensional fusion feature data volume based on the time-frequency spectrum of the logging data;

the missing curve prediction module is configured to acquire a predicted acoustic LWD curve based on the three-dimensional fusion feature data volume through a trained missing curve prediction model;

the stratigraphic structure model correction module is configured to acquire an initial stratigraphic structure model based on the basic data and the acoustic LWD curve of the adjacent well, and correct the initial stratigraphic structure model based on the predicted acoustic LWD curve to acquire a stratigraphic structure model; and the trajectory adjustment module is configured to generate a new drilling trajectory based on the stratigraphic structure model and the drilling trajectory of the target well location through the data processing device, and transmit the new drilling trajectory to the drill bit.

In some preferred implementations, before the basic data of the target well location and the basic data of the adjacent well are acquired, an outlier is removed specifically by:

A10: arranging and combining acquired raw data to generate a to-be-processed dataset $X=\{x_1, \ldots, x_i, \ldots, x_n\}$, $1 \leq i \leq n$, $\forall x_i \in X$, $x_i=(x_{i1}, \ldots, x_{i\xi})$, where $\xi$ denotes any integer from 1 to 15; $x_i$ denotes a data point; and i denotes a serial number of a data type;

A20: randomly selecting $\varphi$ data points from the to-be-processed dataset X to form a to-be-processed data subset X' to be stored in a root node;

A30: randomly selecting a dimension q from the to-be-processed dataset X, and randomly generating a cutting point p in the dimension q, where the cutting point p satisfies $\min(x_{ij}, j=q, x_j \in X') < p < \max(x_{ij}, j=q, x_{ij} \in X')$, j denoting a serial number of the data point;

A40: generating a hyperplane based on the cutting point p to divide data in the dimension q into two subspaces, and storing a data point with a value less than p in the dimension q in a first leaf node and a data point with a value greater than or equal to p in the dimension q in a second leaf node;

A50: performing recursive processing according to steps A30 and A40 until all leaf nodes each include only one data point or an isolated tree reaches a preset height;

A60: repeating steps A30 to A50 until T isolated trees are generated, where the T isolated trees each exclude a leaf node or an external node, or include two leaf nodes $\{T_l, T_r\}$ and one internal node test; the internal node test includes the dimension q and the cutting point p; and a point satisfying q<p belongs to $T_l$ while a point not satisfying q<p belongs to $T_r$;

A70: forming an isolated forest by the T isolated trees; letting each data point $x_i$ traverse each of the isolated trees; calculating a height $h(x_i)$ of the data point $x_i$ in each of the isolated trees, specifically, a number of edges that the data point $x_i$ passes through from the root node to the leaf node in each of the isolated trees; calculating an average height of the data point $x_i$ in the isolated forest; and normalizing the average height of each data point to acquire a normalized average height $\overline{h(x_i)}$ of the data point; and A80: calculating an outlier score $s(x,\varphi)$ based on the normalized average height $\overline{h(x_i)}$ of the data point:

$$s(x, \varphi) = 2^{\frac{E(\overline{h(x_i)})}{c(\varphi)}};$$

where, $\overline{c(\varphi)}$ denotes an average value of a path length of a binary tree constructed by the $\varphi$ data points, and E(*) denotes an expectation;

$$\overline{c(\varphi)} = \begin{cases} 2H(\varphi-1) - \frac{2(\varphi-1)}{\varphi}, & \varphi > 2 \\ 1, & \varphi = 2 \\ 0, & \varphi < 2 \end{cases};$$

where, H(i) denotes a harmonic number, estimated by ln(i)+0.5772156649; and 0.5772156649 denotes a Euler constant; and removing, when the outlier score $s(x,\varphi)$ is less than a preset outlier threshold s, a corresponding data point to acquire effective logging data, $C=\{c_1, \ldots, c_\alpha, \ldots, c_m\}$ where $1 \leq \alpha \leq m$; $c_\alpha \in C$; and m denotes a number of data points of the effective logging data, and the effective logging data refers to the basic data of the target well location and the basic data of the adjacent well.

In some preferred implementations, the calculating a first correlation value between each type of the basic data of the adjacent well and the acoustic LWD curve thereof specifically includes:

calculating a Pearson correlation coefficient between each type of the basic data of the adjacent well and the acoustic LWD curve thereof as the first correlation value $S_{im1}$:

$$S_{im1} = \frac{\sum_{i=1}^{n}(C_i - \overline{C})(Y_i - \overline{Y})}{\sqrt{\sum_{i=1}^{n}(C_i - \overline{C})^2}\sqrt{\sum_{i=1}^{n}(Y_i - \overline{Y})^2}};$$

where, $C_i$ denotes a value of the acoustic LWD curve of the adjacent well at a data point i; $Y_i$ denotes a value of any type of the basic data of the adjacent well at the data point i; $\overline{C}$ denotes an average value of the acoustic LWD curve of the adjacent well; $\overline{Y}$ denotes an average value of any type of the basic data of the adjacent well; i denotes the serial number of the data point; and n denotes a number of data points.

In some preferred implementations, the performing dimensionality reduction on each of the non-redundant basic data groups specifically includes:

performing, by a t-distributed stochastic neighbor embedding (t-SNE) method, nonlinear dimensionality reduction on the non-redundant basic data group of the lithological group data, the electrical group data, the porosity group data, the drilling group data, or the logging group data at the same group, specifically:

selecting, from the non-redundant basic data group $Y=\{y_1, \ldots, y_\alpha, \ldots, y_m\}$, any data points $y_\alpha$ and $y_\beta$ $1 \le \alpha, \beta \le m$, $y_\alpha$, $y_\beta \in Y$, where $y_\beta$ follows a Gaussian distribution $P_\alpha$ centered on $y_\alpha$ with a variance of $\sigma_\beta$, and $y_\alpha$ follows a Gaussian distribution $P_\beta$ centered on $y_\beta$ with a variance of $\sigma_\alpha$; and a conditional probability $P_{\beta|\alpha}$ for a similarity between the data points $y_\alpha$ and $y_\beta$ is:

$$P_{\beta|\alpha} = \frac{\exp(-\|y_\alpha - y_\beta\|^2 / 2\sigma_\alpha^2)}{\sum_{a \ne b} \exp(-\|y_\alpha - y_b\|^2 / 2\sigma_\alpha^2)};$$

where, a perplexity Perp is specified by a user based on $\sigma_\alpha$, $\text{Perp}(P_\alpha) = 2^{H(P_\alpha)}$, where $H(P_\alpha)$ denotes a Shannon information entropy of the Gaussian distribution $P_\alpha$:

$$H(P_\alpha) = -\sum_\beta P_{\beta|\alpha} \log_2 p_{\beta|\alpha};$$

the conditional probability for the similarity between the data points $y_\alpha$ and $y_\beta$ includes a pairwise-similarity joint probability $P_{\alpha\beta}$ in all the data points:

$$p_{\alpha\beta} = \frac{p_{\beta|\alpha} + p_{\alpha|\beta}}{2m};$$

where, $p_{\alpha|\beta}$ denotes the conditional probability for the similarity between the data points $y_\beta$ and $y_\alpha$;
assuming that a dimensionality-reduced logging dataset constructed based on the effective logging data $Y = \{y_1, \ldots, y_\alpha, \ldots, y_m\}$ is $Z = \{z_1, \ldots, z_\alpha, \ldots, z_m\}$ and the effective logging data is in a high-dimensional space relative to the dimensionality-reduced logging dataset, then calculating a joint probability $q_{\alpha\beta}$ of simulated points $z_\alpha$ and $z_\beta$ corresponding to the data points $y_\alpha$ and $y_\beta$ in the dimensionality-reduced logging dataset:

$$q_{\alpha\beta} = \frac{(1 + \|z_\alpha - z_\beta\|^2)^{-1}}{\sum_{\varepsilon1 \ne \varepsilon2}(1 + \|z_{\varepsilon1} - z_{\varepsilon2}\|^2)^{-1}};$$

where, $1 \le \varepsilon1, \varepsilon2 \le m$; $z_{\varepsilon1}$ and $z_{\varepsilon2}$ denote two different points in the dimensionality-reduced logging dataset, $z_{\varepsilon1}$, $z_{\varepsilon2} \in Z$; the calculation of each joint probability $q_{\alpha\beta}$ traverses every two different points in the dimensionality-reduced logging dataset;
measuring, based on the pairwise-similarity joint probability $P_{\alpha\beta}$ of the conditional probability for the similarity between the data points $y_\alpha$ and $y_\beta$ in all the data points and the joint probability $q_{\alpha\beta}$ of the simulated points $Z_\alpha$ and $Z_\beta$ corresponding to the data points $y_\alpha$ and $y_\beta$ in the dimensionality-reduced logging dataset, a third similarity value $S_{im3}$ between a probability distribution Q of the dimensionality-reduced logging dataset and a high-dimensional spatial probability distribution P of the effective logging data through a Kullback-Leibler (KL) divergence:

$$S_{im3} = KL(P\|Q) = \sum_\alpha \sum_\beta p_{\alpha\beta} \log \frac{p_{\alpha\beta}}{q_{\alpha\beta}};$$

where, a smaller third similarity value C indicates a higher simulation accuracy of the simulated points in the dimensionality-reduced logging dataset;
minimizing the KL divergence through a gradient descent method:

$$\frac{\delta S_{im3}}{\delta z_\alpha} = 4 \sum_\beta (p_{\alpha\beta} - q_{\alpha\beta})(z_\alpha - z_\beta)(1 + \|z_\alpha - z_\beta\|^2)^{-1};$$

acquiring the dimensionality-reduced logging dataset $Z = \{z_1, \ldots, z_\alpha, \ldots, z_m\}$; and
retaining a first dimension of the dimensionality-reduced logging dataset and deleting remaining dimensions thereof to acquire dimensionality-reduced feature parameters $\hat{Z} = \{\hat{z}_1, \ldots, \hat{z}_\alpha, \ldots, \hat{z}_m\}$; and selecting a dimensionality-reduced feature parameter of one dimension for explaining most content.

In some preferred implementations, the time-frequency spectrum of the logging data is calculated as follows:
setting 10 data points as one depth unit based on the lithological group data of the basic data of the target well location;
calculating an average value $\bar{x}_{lit}$ of the lithological group data of each depth unit:

$$\bar{x}_{lit} = \frac{x_{g1} + x_{g2} + \ldots + x_{g10}}{10};$$

where, g denotes a group number;
calculating a difference between the average values $\bar{x}_{lit}$ of the lithological group data of each two adjacent depth units:

$$d_u = \bar{x}_{lit(u+1)} - \bar{x}_{lit(u)}$$

setting, if $d_e > 10$, a lower depth unit of the two adjacent depth units as a lithological abrupt position, and calculating a number $h_t$ of depth units between each two abrupt positions to represent a formation thickness, where u denotes a serial number of the depth unit;
forming a frequency unit by $h_t$ data points of fusion feature parameters, and calculating a frequency domain value of each frequency unit:

$$X[f] = \sum_{k=0}^{9} x_{\gamma g k} e^{-j\left(\frac{2\pi}{10}\right) f k};$$

forming a $h_t \times 10$ time-frequency spectrum by values with frequencies f of 5, 10, 15, 20, 25, 30, 35, 40, 45, and 50, together with the $h_t$ data points, where k denotes a serial number ranging from 1 to 10 for an intra-group data point, and $\gamma$ denotes a serial number ranging from 1 to z for the fusion feature parameters; and
connecting the $h_t \times 10$ time-frequency spectrum to z dimensionality-reduced feature parameters to acquire a three-dimensional dimensionality-reduced feature data volume $h_t \times 10 \times z$.

In some preferred implementations, the acquiring a predicted acoustic LWD curve through a trained missing curve prediction model specifically includes:
training the missing curve prediction model including a t-channel image recognition network with 2t convolutional layers and 2t average pooling layers, where each channel includes a first convolutional layer, a first average pooling layer, a second convolutional layer, and a second average pooling layer that are sequentially connected; each convolutional layer has a different size; an f-th channel includes a (4*f−1)*(4*f−1) first convolutional layer, a (4*f+4)*(4*f+4) second convolutional layer, and 2*2 pooling layers; all the channels are connected together to one fully connected layer and one naive Bayesian decision maker;

a first convolutional layer of a first channel, a first convolutional layer of a second channel, and a first convolutional layer of a third channel are denoted as C1, C3, and C5 layers, respectively, the C1 layer is configured to convolve an input image through 8 $h_r \times h_r \times h_t$ convolution kernels; the C3 layer is configured to convolve an input image through 8 $3h_r \times 3h_r \times 3h_t$ convolution kernels; and the C5 layer is configured to convolve an input image through 8 $5h_r \times 5h_r \times 5h_t$ convolution kernels;

$$con^l_{p,q} = \sum_{m1=1}^{L} \sum_{m2=1}^{W} CON^{l-1}_{m1,m2} \times ker^l_{p,q} + b^l_{p,q};$$

$con_{p,q}^l$ denotes a convolution result at a position (p, q); l denotes a current layer number; CON denotes a matrix covered by the convolution kernels; L and W denote a length and a width of the matrix covered by the convolution kernels; m1 and m2 respectively denote a serial number of a length of the convolution kernel and a serial number of a width of the convolution kernel, ranging from 1 to L; ker denotes a kernel function; and b denotes a corresponding bias term;

fitting the convolution result by a rectified linear unit (ReLU) function to acquire a fitted convolution result;

performing upsampling pooling on the fitted convolution result:

$$con_{m3,m4}^l = \max(CON_{m1,m2}^{l-1});$$

where, $con_{m3,m4}^l$ denotes a two-dimensional matrix representation of a pooled convolution result; and m3, m4 denotes a convolution result at a position (m3, m4);

converting the pooled convolution result into a flattened one-dimensional feature vector through a flattened layer;

integrating the flattened one-dimensional feature vector through the fully connected layer:

$$con^l_{key} = \sum_{r=1}^{R} con^{key-1}_r \cdot w^l_r + b^l_r;$$

where, $con_i^l$ denotes a one-dimensional matrix representation for features after the integration by the fully connected layer; l denotes the current layer number; key denotes an index value of a one-dimensional matrix; R denotes a length of a feature vector in an (l−1)-th layer; w denotes a weight matrix; b denotes the bias term; and r denotes a serial number of a data point of the feature vector;

introducing the naive Bayesian decision maker into the fully connected layer; and taking the integrated flattened one-dimensional feature vector as the predicted acoustic LWD curve.

In some preferred implementations, the correcting the initial stratigraphic structure model based on the predicted acoustic LWD curve to acquire a stratigraphic structure model specifically includes:

shifting, stretching or compressing the predicted acoustic LWD curve; calculating a second correlation value between the predicted acoustic LWD curve and the acoustic LWD curve of the adjacent well in real time; and determining the predicted acoustic LWD curve as an accurate predicted acoustic LWD curve when the second correlation value reaches a maximum value; and correcting the initial stratigraphic structure model based on the predicted acoustic LWD curve.

A second aspect of the present disclosure proposes an electronic device, including:

at least one processor; and a memory communicatively connected to the at least one processor, where the memory is configured to store an instruction executable by the processor; and the instruction is executed by the processor to implement a function of the above precise deep oil and gas navigation system based on structural evaluation of a sand/shale formation.

A fourth aspect of the present disclosure proposes a computer-readable storage medium, configured to store a computer instruction, where the computer instruction is executed by a computer to implement a function of the above precise deep oil and gas navigation system based on structural evaluation of a sand/shale formation.

The present disclosure has following beneficial effects:

(1) The present disclosure combines bottom layer thickness data with fusion feature parameter data points to construct a three-dimensional data volume for predicting a missing curve, and corrects the geological model constructed based on the data of the adjacent well through the predicted missing curve. The present disclosure achieves accurate geological prediction in situations where comprehensive logging data cannot be acquired during the drilling phase, providing precise guidance for the design of the drilling trajectory. In addition, the present disclosure solves the problem in the prior art that the drilling trajectory generated solely based on the logging data of an adjacent well is rough and poor due to a change in the properties of the formation.

BRIEF DESCRIPTION OF THE DRAWINGS

Other features, objectives and advantages of the present disclosure will become more apparent upon reading the detailed description of the non-restrictive embodiments with reference to the following drawings.

FIG. 1 is a flowchart of a precise deep oil and gas navigation system based on structural evaluation of a sand/shale formation according to an embodiment of the present disclosure.

DETAILED DESCRIPTION OF THE EMBODIMENTS

Figure 2:
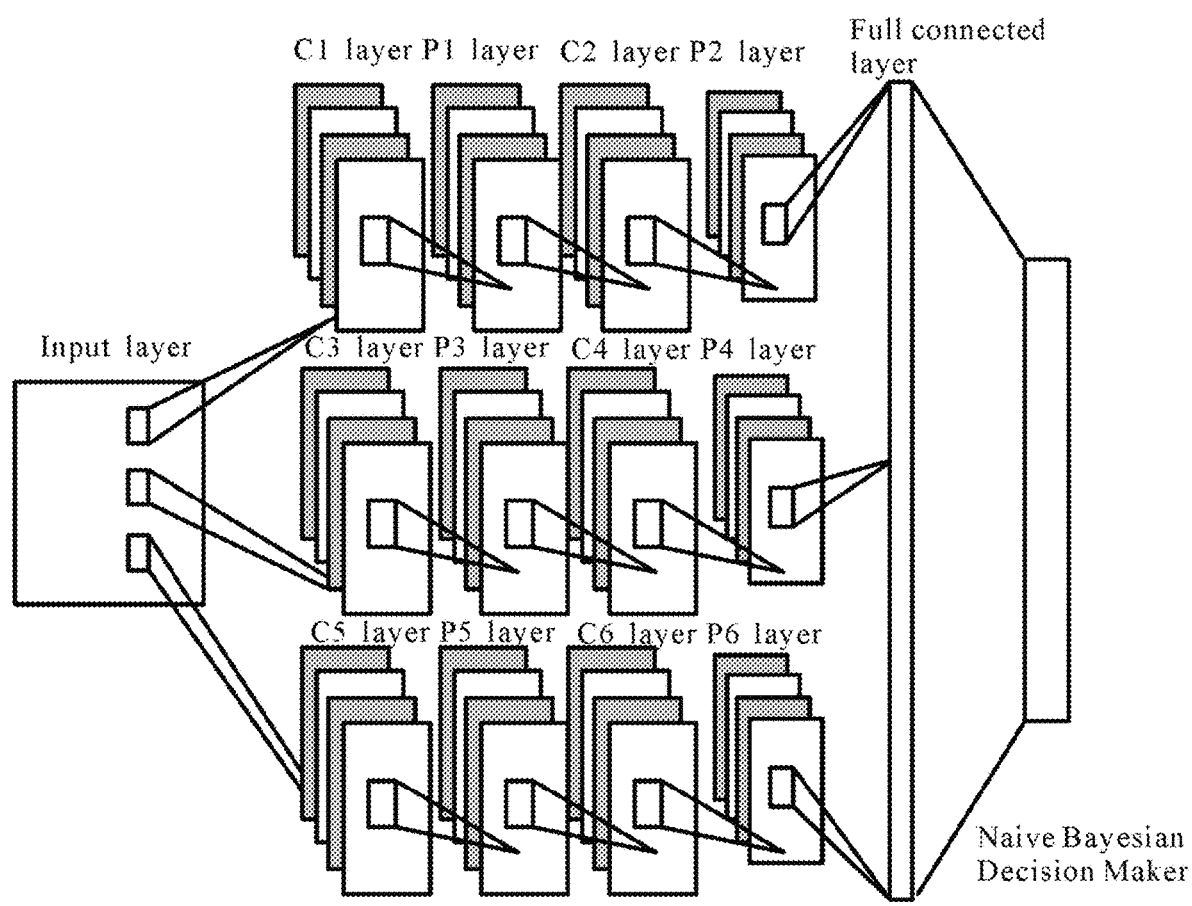
FIG. 2 is a structural diagram of a missing curve prediction model according to an embodiment of the present disclosure.

The present disclosure will be further described in detail below in conjunction with the drawings and embodiments. It should be understood that the specific embodiments described herein are merely intended to explain the present disclosure, rather than to limit the present disclosure. It should also be noted that, for convenience of description, only the parts related to the present disclosure are shown in the drawings.

It should be noted that the embodiments in the present disclosure and features in the embodiments may be combined with each other in a non-conflicting situation. The present disclosure will be described in detail below with reference to the drawings and embodiments.

To more clearly explain a method of a precise deep oil and gas navigation system based on structural evaluation of sand/shale formation, steps in the embodiments of the present disclosure are described in detail below with reference to FIG. 1.

A first embodiment of the present disclosure provides a precise deep oil and gas navigation system based on structural evaluation of a sand/shale formation. The precise deep oil and gas navigation system includes a data acquisition module, an initial trajectory generation module, an interference elimination module, a data dimensionality reduction module, a fusion feature data volume construction module, a missing curve prediction module, a stratigraphic structure model correction module, and a trajectory adjustment module. The functions executed by these modules are described in detail below.

An acoustic logging while drilling (LWD) curve is closely related to a stratigraphic structure, but it is hard to measure with high accuracy while drilling. In addition, a missing or malfunctioning instrument will lead to a missing acoustic LWD curve, resulting in insufficient accuracy of the stratigraphic structure model reconstructed during the drilling process, making it hard to accurately guide the generation of the drilling trajectory.

The particularity of acoustic LWD is that it acquires formation information by measuring the propagation speed and attenuation degree of a sound wave in a formation. When the sound wave propagates in the formation, it is influenced by the physical properties of the formation, such as rock density, Poisson's ratio, and elastic modulus. These parameters have a significant impact on the propagation speed and attenuation of the sound wave. Therefore, acoustic LWD is extremely strongly correlated with frequency information and features can be extracted based on a frequency spectrum. Acoustic LWD can measure the propagation speed and amplitude changes of the sound wave to provide key clues to the density and elastic response of the formation, making it easier to determine the type and composition of the formation. The interface between different rock layers in the formation can cause reflection and refraction of the sound wave. Acoustic LWD can help determine the depth and position of the interface between different formations and draw a stratigraphic structure map by analyzing the reflection and refraction characteristics of the sound wave. Therefore, when stratigraphic structural evaluation is performed, it is necessary to predict the missing curve based on the characteristics of acoustic LWD to improve the accuracy and reliability of stratigraphic structural evaluation.

The precise deep oil and gas navigation system is implemented through a drilling equipment group 100. The drilling equipment group 100 includes a drill bit 102, a drill bit positioning device 104, a drill rod 106, a lithological data acquisition device 108, an electrical data acquisition device 110, a porosity data acquisition device 112, a drilling data acquisition device 114, a logging data acquisition device 116, an acoustic LWD acquisition device 118, a data transmission device 120, and a data processor/processing device 122. The precise deep oil and gas navigation system includes: a data acquisition module, an initial trajectory generation module, an interference elimination module, a data dimensionality reduction module, a fusion feature data volume construction module, a missing curve prediction module, a stratigraphic structure model correction module, and a trajectory adjustment module.

In this embodiment, before the basic data of the target well location and the basic data of the adjacent well are acquired, an outlier is removed specifically by the following steps.

A10. Acquired raw data are arranged and combined to generate to-be-processed dataset $X=\{x_1, \ldots, x_i, \ldots, x_n\}$, $1 \leq i \leq n$, $\forall x_i \in X$, $x_i=(x_{i1}, \ldots, x_{i\xi})$ where $\xi$ denotes any integer from 1 to 15; $x_i$ denotes a data point; and i denotes a serial number of a data type. In this embodiment, the acquired original data includes: CAL, CNL, NEU, PEF, RD, RS, COND, GR, DEN, drilling rate, rotary speed, bit pressure, C1C2, MDIA, and FPPG. The data points are spaced 0.1 m apart from each other.

A20. $\varphi$ data points are randomly selected from the to-be-processed dataset X to form to-be-processed data subset X' to be stored in a root node.

A30. Dimension q is randomly selected from the to-be-processed dataset X, and cutting point p is randomly generated in the dimension q, where the cutting point p satisfies $\min(x_{ij}, j=q, x_{ij} \in X') < p < \max(x_{ij}, j=q, x_{ij} \in X')$, j denoting a serial number of the data point.

A40. A hyperplane is generated based on the cutting point p to divide data in the dimension q into two subspaces, a data point with a value less than p in the dimension q is stored in a first leaf node, and a data point with a value greater than or equal to p is stored in the dimension q in a second leaf node.

A50. Recursive processing is performed according to steps A30 and A40 until all leaf nodes each include only one data point or an isolated tree reaches a preset height. This step involves a cyclic process that continuously cuts the data points until all the data points are separated into individual points.

A60. Steps A30 to A50 are repeated until T isolated trees are generated, where the T isolated trees each exclude a leaf node or an external node, or include two leaf nodes $\{T_l, T_r\}$ and one internal node test; the internal node test includes the dimension q and the cutting point p; and a point satisfying q<p belongs to $T_l$ while a point not satisfying q<p belongs to $T_r$.

A70. An isolated forest is formed by the T isolated trees; each data point $x_i$ traverses each of the isolated trees; height $h(x_i)$ of the data point $x_i$ in each of the isolated trees, specifically, a number of edges that the data point $x_i$ passes through from the root node to the leaf node in each of the isolated trees, is calculated; an average height of the data point $x_i$ in the isolated forest is calculated; and the average height of each data point is normalized to acquire normalized average height $\overline{h(x_i)}$ of the data point.

A80. Outlier score $s(x,\varphi)$ is calculated based on the normalized average height $\overline{h(x_l)}$ of the data point:

$$s(x, \varphi) = 2^{-\frac{E(\overline{h(x_i)})}{\overline{c(\varphi)}}};$$

where, $\overline{c(\varphi)}$ denotes an average value of a path length of a binary tree constructed by the $\varphi$ data points, and $E(*)$ denotes an expectation.

$$\overline{c(\varphi)} = \begin{cases} 2H(\varphi-1) - \frac{2(\varphi-1)}{\varphi}, & \varphi > 2 \\ 1, & \varphi = 2 \\ 0, & \varphi < 2 \end{cases};$$

where, $H(i)$ denotes a harmonic number, estimated by $\ln(i)+0.5772156649$; and $0.57721566490$ denotes a Euler constant.

When the outlier score $s(x,\varphi)$ is less than preset outlier threshold s, a corresponding data point is removed to acquire effective logging data, $C=\{c_1, \ldots, c_\alpha, \ldots c_m\}$, where $1 \leq \alpha \leq m$; $c_\alpha \in C$; and m denotes a number of data points of the effective logging data, and the effective logging data refers to the basic data of the target well location and the basic data of the adjacent well.

The lithological data acquisition device, the electrical data acquisition device, the porosity data acquisition device, the drilling data acquisition device, and the logging data acquisition device are configured to acquire the basic data of the adjacent well; the acoustic LWD acquisition device is configured to acquire the acoustic LWD curve of the adjacent well, and upload the acoustic LWD curve to the data processing device through the data transmission device in the drill rod; and the data transmission device includes an optical fiber and a data cable for wire or wireless communication.

The drill bit is configured to drill according to the drilling trajectory, acquire the basic data of the target well location in real time through the following lithological data acquisition device, electrical data acquisition device, porosity data acquisition device, and drilling data acquisition device, and upload the basic data to the data processing device through the data transmission device in the drill rod.

The data acquisition module is configured to acquire basic data of a target well location as well as basic data and an acoustic LWD curve of an adjacent well through a logging device, and divide the basic data of the target well location and the basic data of the adjacent well into lithological group data, electrical group data, porosity group data, drilling group data, and logging group data through the data processing device, where the lithological group data includes: neutron logging (NEU), photoelectric factor (PEF), and gamma ray (GR); the electrical group data includes: deep investigate double lateral resistivity log (RD), shallow investigate double lateral resistivity log (RS), and induction conductivity (COND); the porosity group data includes: borehole diameter (CAL), compensated neutron log (CNL), and density (DEN); the drilling group data includes drilling rate, rotary speed, and bit pressure; and the logging group data includes C1C2, MDIA, and FPPG.

The initial trajectory generation module is configured to generate a drilling trajectory of the target well location based on the basic data and the acoustic LWD curve of the adjacent well through the data processing device, and transmit the drilling trajectory to the drill bit through the data transmission device.

The drill bit is configured to drill according to the drilling trajectory, acquire the basic data of the target well location in real time through the following lithological data acquisition device, electrical data acquisition device, porosity data acquisition device, and drilling data acquisition device, and upload the basic data to the data processing device through the data transmission device in the drill rod.

The interference elimination module is configured to calculate a first correlation value between each type of the basic data of the adjacent well and the acoustic LWD curve thereof, and eliminate a data type with the first correlation value lower than a preset first correlation threshold from the basic data of the target well location to acquire z non-redundant basic data groups, where z denotes an integer from 1 to 5.

In this embodiment, the first correlation value between each type of the basic data of the adjacent well and the acoustic LWD curve thereof is specifically calculated as follows.

A Pearson correlation coefficient between each type of the basic data of the adjacent well and the acoustic LWD curve thereof is calculated as the first correlation value $S_{im1}$:

$$S_{im1} = \frac{\sum_{i=1}^{n}(C_i - \overline{C})(Y_i - \overline{Y})}{\sqrt{\sum_{i=1}^{n}(C_i - \overline{C})^2}\sqrt{\sum_{i=1}^{n}(Y_i - \overline{Y})^2}};$$

where, $C_i$ denotes a value of the acoustic LWD curve of the adjacent well at data point i; $Y_i$ denotes a value of any type of the basic data of the adjacent well at the data point i; $\overline{C}$ denotes an average value of the acoustic LWD curve of the adjacent well; $\overline{Y}$ denotes an average value of any type of the basic data of the adjacent well; i denotes the serial number of the data point; and n denotes a number of data points. In this embodiment, the first correlation value is set as extremely strongly correlated between 0.8 and 1, strongly correlated between 0.6 and 0.8, moderately correlated between 0.4 and 0.6, weakly correlated between 0.2 and 0.4, and extremely weakly correlated or uncorrelated between 0 and 0.2. In this embodiment, moderately correlated, weakly correlated, extremely weakly correlated, or uncorrelated parameters are removed. The grouping of the basic data is still followed after the removal. There may still be a certain basic data group with 1 data type, 2 data types, or 3 data types remained. In case all basic data groups are excluded, only non-redundant basic data groups with basic data are retained.

Due to information redundancy among parameters within the same group, the prediction speed and accuracy of the missing acoustic LWD curve will be affected. Therefore, it is necessary to fuse multi-dimensional parameters within the same group into one-dimensional feature parameters.

The data dimensionality reduction module is configured to perform dimensionality reduction on each of the non-redundant basic data groups to acquire z fusion feature parameters.

In this embodiment, the dimensionality reduction on each of the non-redundant basic data groups is specifically performed as follows.

Nonlinear dimensionality reduction is performed on the non-redundant basic data group of the lithological group data, the electrical group data, the porosity group data, the drilling group data, or the logging group data at the same group by a t-distributed stochastic neighbor embedding (t-SNE) method, specifically:

Any data points $y_\alpha$ and $y_\beta$ $1 \leq \alpha, \beta \leq m$, $y_\alpha, y_\beta \in Y$ are selected from the non-redundant basic data group $Y=\{y_1, \ldots, y_\alpha, \ldots, y_m\}$, where $y_\beta$ follows Gaussian distribution $P_\alpha$ centered on $y_\alpha$ with a variance of $\sigma_\beta$ and $y_\alpha$ follows Gaussian distribution $P_\beta$ centered on $y_\beta$ with a variance of $\sigma_\alpha$; and conditional probability $P_{\beta|\alpha}$ for a similarity between the data points $y_\alpha$ and $y_\beta$ is:

$$P_{\beta|\alpha} = \frac{\exp(-\|y_\alpha - y_\beta\|^2/2\sigma_\alpha^2)}{\sum_{a \neq b}\exp(-\|y_\alpha - y_b\|^2/2\sigma_\alpha^2)};$$

where, a perplexity Perp is specified by a user based on $\sigma_\alpha$, $Perp(P_\alpha)=2^{H(P_\alpha)}$, where $H(P_\alpha)$ denotes a Shannon information entropy of the Gaussian distribution $P_\alpha$:

$$H(P_\alpha) = -\sum_\beta P_{\beta|\alpha} \log_2 p_{\beta|\alpha}.$$

The conditional probability for the similarity between the data points $y_\alpha$ and $y_\beta$ includes pairwise-similarity joint probability $P_{\alpha\beta}$ in all the data points:

$$p_{\alpha\beta} = \frac{p_{\beta|\alpha} + p_{\alpha|\beta}}{2m};$$

where, $P_{\alpha|\beta}$ denotes the conditional probability for the similarity between the data points $y_\beta$ and $y_\alpha$.

It is assumed that a dimensionality-reduced logging dataset constructed based on the effective logging data $Y=\{y_1, \ldots, y_\alpha, \ldots, y_m\}$ is $Z=\{z_1, \ldots, z_\alpha, \ldots, z_m\}$ and the effective logging data is in a high-dimensional space relative to the dimensionality-reduced logging dataset, then joint probability $q_{\alpha\beta}$ of simulated points $z_\alpha$ and $z_\beta$ corresponding to the data points $y_\alpha$ and $y_\beta$ in the dimensionality-reduced logging dataset is calculated:

$$q_{\alpha\beta} = \frac{(1 + \|z_\alpha - z_\beta\|^2)^{-1}}{\sum_{\varepsilon 1 \neq \varepsilon 2}(1 + \|z_{\varepsilon 1} - z_{\varepsilon 2}\|^2)^{-1}};$$

where, $1 \leq \varepsilon 1, \varepsilon 2 \leq m$; $z_{\varepsilon 1}$ and $z_{\varepsilon 2}$ denote two different points in the dimensionality-reduced logging dataset, $z_{\varepsilon 1}, z_{\varepsilon 2} \in Z$; the calculation of each joint probability $q_{\alpha\beta}$ traverses every two different points in the dimensionality-reduced logging dataset.

Based on the pairwise-similarity joint probability $P_{\alpha\beta}$ of the conditional probability for the similarity between the data points $y_\alpha$ and $y_\beta$ in all the data points and the joint probability $q_{\alpha\beta}$ of the simulated points $Z_\alpha$ and $Z_\beta$ corresponding to the data points $y_\alpha$ and $y_\beta$ in the dimensionality-reduced logging dataset, third similarity value $S_{im3}$ between a probability distribution Q of the dimensionality-reduced logging dataset and a high-dimensional spatial probability distribution P of the effective logging data is measured through a Kullback-Leibler (KL) divergence:

$$S_{im3} = KL(P\|Q) = \sum_\alpha \sum_\beta p_{\alpha\beta} \log \frac{p_{\alpha\beta}}{q_{\alpha\beta}};$$

where, smaller third similarity value C indicates a higher simulation accuracy of the simulated points in the dimensionality-reduced logging dataset.

The KL divergence is minimized through a gradient descent method:

$$\frac{\delta S_{im3}}{\delta z_\alpha} = 4\sum_\beta (p_{\alpha\beta} - q_{\alpha\beta})(z_\alpha - z_\beta)(1 + \|z_\alpha - z_\beta\|^2)^{-1};$$

The dimensionality-reduced logging dataset $Z=\{z_1, \ldots, z_\alpha, \ldots, z_m\}$ is acquired.

A first dimension of the dimensionality-reduced logging dataset is retained and remaining dimensions thereof are deleted to acquire dimensionality-reduced feature parameters $\hat{Z}=\{\hat{z}_1, \ldots, \hat{z}_\alpha, \ldots, \hat{z}_m\}$; and a dimensionality-reduced feature parameter of one dimension for explaining most content is selected.

Due to the non-linear mapping between geophysical data and marker layers, linear dimensionality reduction method like principal component analysis (PCA) cannot distinguish data of different classes, which affects subsequent clustering. Therefore, it is necessary to perform non-linear dimensionality reduction on the data through the t-SNE method.

The fusion feature data volume construction module is configured to select fusion feature parameters of the lithological group data based on the basic data of the target well location, perform geological stratification to acquire a time-frequency spectrum of logging data, and convert the z fusion feature parameters into a three-dimensional fusion feature data volume based on the time-frequency spectrum of the logging data.

Due to the significant differences in the response of acoustic LWD in different rock formations, if the same missing acoustic LWD curve prediction algorithm is used for all formations, the results acquired will be very inaccurate.

Therefore, it is necessary to design specific missing acoustic LWD curve prediction algorithms for different rock formations.

In this embodiment, the time-frequency spectrum of the logging data is calculated as follows.

10 data points are set as one depth unit based on the lithological group data of the basic data of the target well location. In the sand/shale formation, the lithological group data is extremely sensitive to lithological changes, so the time-frequency spectrum is determined through the lithological group data.

Average value $\bar{x}_{lit}$ of the lithological group data of each depth unit is calculated:

$$\bar{x}_{lit} = \frac{x_{g1} + x_{g2} + \ldots + x_{g10}}{10};$$

where, g denotes a group number.

A difference between the average values $\bar{x}_{lit}$ of the lithological group data of each two adjacent depth units is calculated:

$$d_u = \bar{x}_{lit(u+1)} - \bar{x}_{lit(u)}.$$

If $d_e>10$, a lower depth unit of the two adjacent depth units is set as a lithological abrupt position, and number $h_t$ of depth units between each two abrupt positions is calculated to represent a formation thickness, where u denotes a serial number of the depth unit.

A frequency unit is formed by $h_t$ data points of fusion feature parameters, and calculating a frequency domain value of each frequency unit:

$$X[f] = \sum_{k=0}^{9} x_{\gamma g k} e^{-j\left(\frac{2\pi}{10}\right)fk}.$$

A $h_t\times 10$ time-frequency spectrum is formed by values with frequencies f of 5, 10, 15, 20, 25, 30, 35, 40, 45, and 50, together with the $h_t$ data points, where k denotes a serial number ranging from 1 to 10 for an intra-group data point, and $\gamma$ denotes a serial number ranging from 1 to z for the fusion feature parameters.

The $h_t\times 10$ time-frequency spectrum is connected to the z fusion feature parameters to acquire the three-dimensional fusion feature data volume $h_t\times 10\times z$.

The acoustic LWD measurements are influenced by the formation of the same depth and formations of a certain thickness above and below. Therefore, this embodiment replaces the method of predicting missing curves based on one-dimensional information used in the prior art with a method of constructing a three-dimensional data volume based on a time-frequency spectrum for subsequent prediction. This is equivalent to expanding point-to-point prediction into volume-to-point prediction, which incorporates the influence of the formations of a certain thickness above and below the target location into the analysis, improving the accuracy of prediction.

The missing curve prediction module is configured to acquire a predicted acoustic LWD curve based on the three-dimensional fusion feature data volume through a trained missing curve prediction model.

An original convolutional neural network includes a convolutional layer, a pooling layer, and a fully connected layer. Considering the particularity of the input data with multi-band frequency features, the present disclosure increases the number of convolutional layers and improves the acoustic feature extraction effect of the input data through a multi-layer network structure.

In this embodiment, the predicted acoustic LWD curve is specifically acquired through a trained missing curve prediction model as follows.

The missing curve prediction model is trained, including a t-channel image recognition network with 2t convolutional layers and 2t average pooling layers, where each channel includes a first convolutional layer, a first average pooling layer, a second convolutional layer, and a second average pooling layer that are sequentially connected; each convolutional layer has a different size; an f-th channel includes a $(4*f-1)*(4*f-1)$ first convolutional layer, a $(4*f+4)*(4*f+4)$ second convolutional layer, and $2*2$ pooling layers; all the channels are connected together to one fully connected layer and one naive Bayesian decision maker.

In this embodiment, the missing curve prediction model is shown in FIG. 2. A C1 layer convolves the input image through 8 3*3*3 convolution kernels to generate 8 190*190 feature maps. Pooling layer P1 pools the convolutional layer C1 in 2*2 units. The P1 layer includes 8 95*95 feature maps. P1 is convolved through 16 8*8 convolution kernels to acquire convolutional layer C2, which includes 16 88*88 feature maps. C2 is pooled in 2*2 units to generate pooling layer P2, which includes 16 44*44 feature maps.

The C3 layer convolves the input image through 8 7*7*7 convolution kernels to generate 8 186*186 feature maps. Pooling layer P3 pools the convolutional layer C3 in 2*2 units. The P3 layer includes 8 93*93 feature maps. P3 is convolved through 16 12*12 convolution kernels to generate convolutional layer C4, which includes 16 82*82 feature maps. C4 is pooled in 2*2 units to generate pooling layer P4, which includes 16 41*41 feature maps.

A C5 layer convolves the input image through 8 11*11*11 convolution kernels to generate 8 182*182 feature maps. The pooling layer P5 pools the convolutional layer C5 in 2*2 units. The P5 layer includes 8 91*91 feature maps. P5 is convolved through 16 16*16 convolution kernels to generate the convolutional layer C5, which includes 16 76*76 feature maps. C6 is pooled in 2*2 units to generate pooling layer P6, which includes 16 38*38 feature maps.

A first convolutional layer of a first channel, a first convolutional layer of a second channel, and a first convolutional layer of a third channel are denoted as C1, C3, and C5 layers, respectively, where the C1 layer is configured to convolve an input image through 8 $h_t\times h_t\times h_t$ convolution kernels; the C3 layer is configured to convolve an input image through 8 $3h_t\times 3h_t\times 3h_t$ convolution kernels; and the C5 layer is configured to convolve an input image through 8 $5h_t\times 5h_t\times 5h_t$ convolution kernels;

$$con_{p,q}^l = \sum_{m1=1}^{L}\sum_{m2=1}^{W} CON_{m1,m2}^{l-1} \times ker_{p,q}^l + b_{p,q}^l \cdot con_{p,q}^l$$

denotes a convolution result at position (p, q); l denotes a current layer number; CON denotes a matrix covered by the convolution kernels; L and W denote a length and a width of the matrix covered by the convolution kernels; m1 and m2 respectively denote a serial number of a length of the convolution kernel and a serial number of a width of the convolution kernel, ranging from 1 to L; ker denotes a kernel function; and b denotes a corresponding bias term.

The convolution result is fitted by a rectified linear unit (ReLU) function to acquire a fitted convolution result.

Upsampling pooling is performed on the fitted convolution result:

$$con_{m3,m4}^l = \max(CON_{m1,m2}^{l-1});$$

where, $con_{m3,m4}^l$ denotes a two-dimensional matrix representation of a pooled convolution result; and m3, m4 denotes a convolution result at position (m3, m4).

The pooled convolution result is converted into a flattened one-dimensional feature vector through a flattened layer.

The flattened one-dimensional feature vector is integrated through the fully connected layer:

$$con_{key}^l = \sum_{r=1}^{R} con_r^{key-1}\cdot w_r^l + b_r^l;$$

where, $con_i^l$ denotes a one-dimensional matrix representation for features after the integration by the fully connected layer; l denotes the current layer number; key denotes an index value of a one-dimensional matrix; R denotes a length of a feature vector in an (l−1)-th layer; w denotes a weight matrix; b denotes the bias term; and r denotes a serial number of a data point of the feature vector.

The naive Bayesian decision maker is introduced into the fully connected layer.

The integrated flattened one-dimensional feature vector is taken as the predicted acoustic LWD curve.

A naive Bayesian decision maker replaces a Softmax decision maker. A Softmax classifier serves as the main classifier of convolutional neural networks. However, for the Softmax classifier, the classification is only considered correct when the probability of classification is greater than 90%, and a loss function will continuously calculate the running time. As for the naive Bayesian decision maker, when given a target value, attributes are conditionally independent of each other, reducing computational parameters and saving energy consumption and time. In addition, the algorithm is simple, fast, and more conducive to real-time fracture recognition while drilling.

When encountering a complex formation, due to the different sizes of convolution kernels, the extracted features can reflect the different hierarchical features of the acoustic LWD curve, effectively improving the prediction accuracy of the acoustic LWD curve. A smaller-size convolution kernel reflects a shallower feature, while a larger-size convolution kernel reflects a deeper feature.

In this embodiment, the missing curve prediction model is further evaluated using two statistical performance indicators: mean absolute percentage error (MAPE) and root mean square error (RMSE). The purpose of MAPE and RMSE is to evaluate model performance by comparing an error between model output and prediction, with a smaller error value indicating better model performance. The MAPE and RMSE are calculated as follows.

$$MAPE = \frac{100}{N}\sum_{i=1}^{N}\left|\frac{y_m - y_p}{y_m}\right|;$$

$$RMSE = \sqrt{\frac{\sum_{i=1}^{N}(y_p - y_m)^2}{N}};$$

where, N denotes a number of observations; $y_m$ denotes measured data; $y_p$ denotes predicted data; and MAPE and RMSE denote averages of the measured data and the predicted data, respectively.

Figure 3:
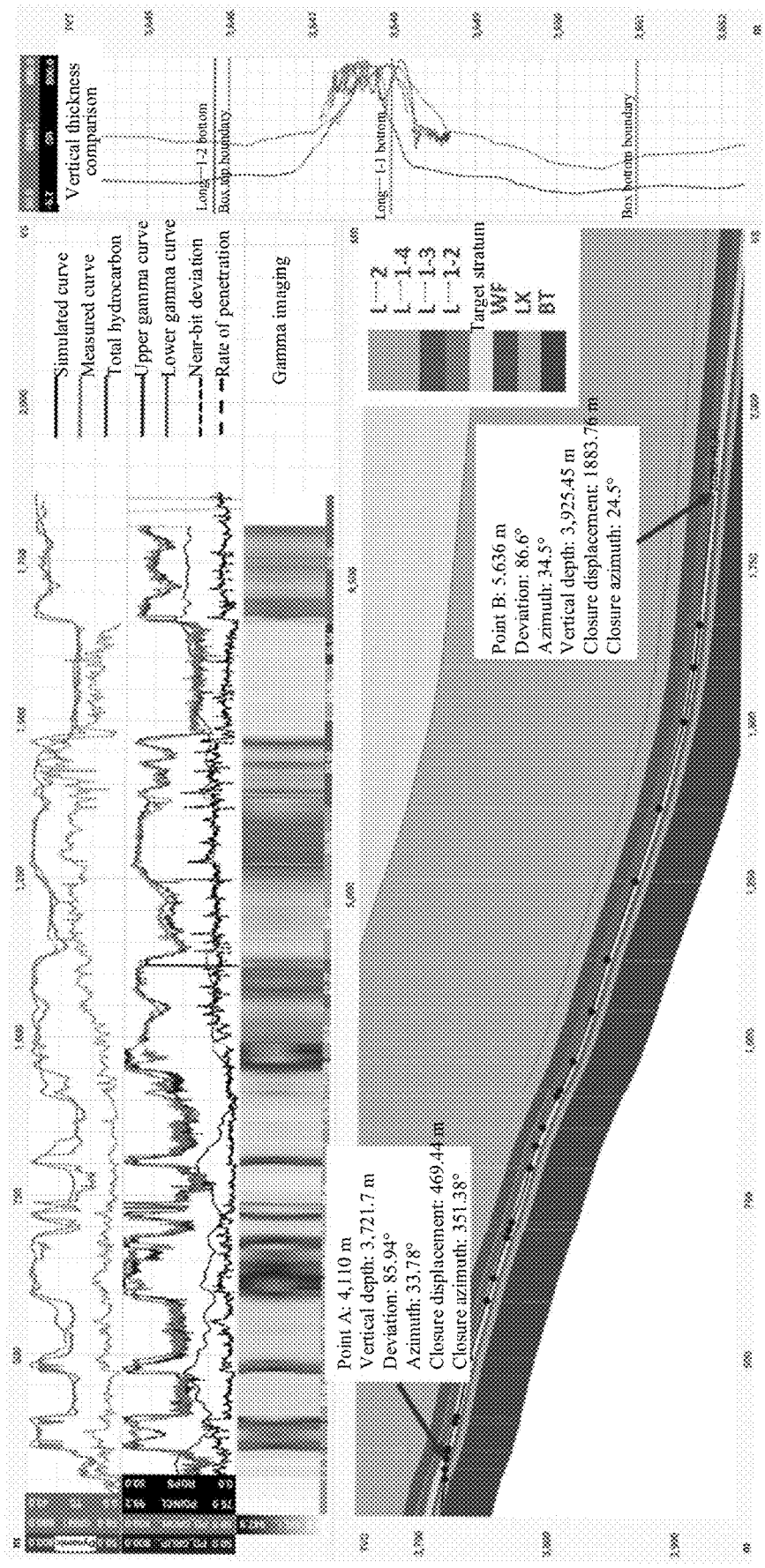
FIG. 3 is a structural diagram of an initial stratigraphic structure model according to an embodiment of the present disclosure.

The stratigraphic structure model correction module is configured to acquire an initial stratigraphic structure model based on the basic data and the acoustic LWD curve of the adjacent well, and correct the initial stratigraphic structure model based on the predicted acoustic LWD curve to acquire a stratigraphic structure model. In specific application scenarios, as the adjacent well has already been drilled, more comprehensive and reliable drilling data can be acquired. In addition, as the data of the adjacent well has been demonstrated through other drilling information, accurate information on the stratigraphic structure can be determined. However, the dip angle and other parameters of the target well location may have deviations due to positional deviations, so it is necessary to correct them through the predicted acoustic LWD curve so as to acquire an accurate LWD stratigraphic structure model for guiding the generation of the drilling trajectory. The initial stratigraphic structure model acquired from the basic data and the acoustic LWD curve of the adjacent well is shown in FIG. 3.

In this embodiment, the initial stratigraphic structure model is specifically corrected based on the predicted acoustic LWD curve to acquire the stratigraphic structure model.

Figure 4:
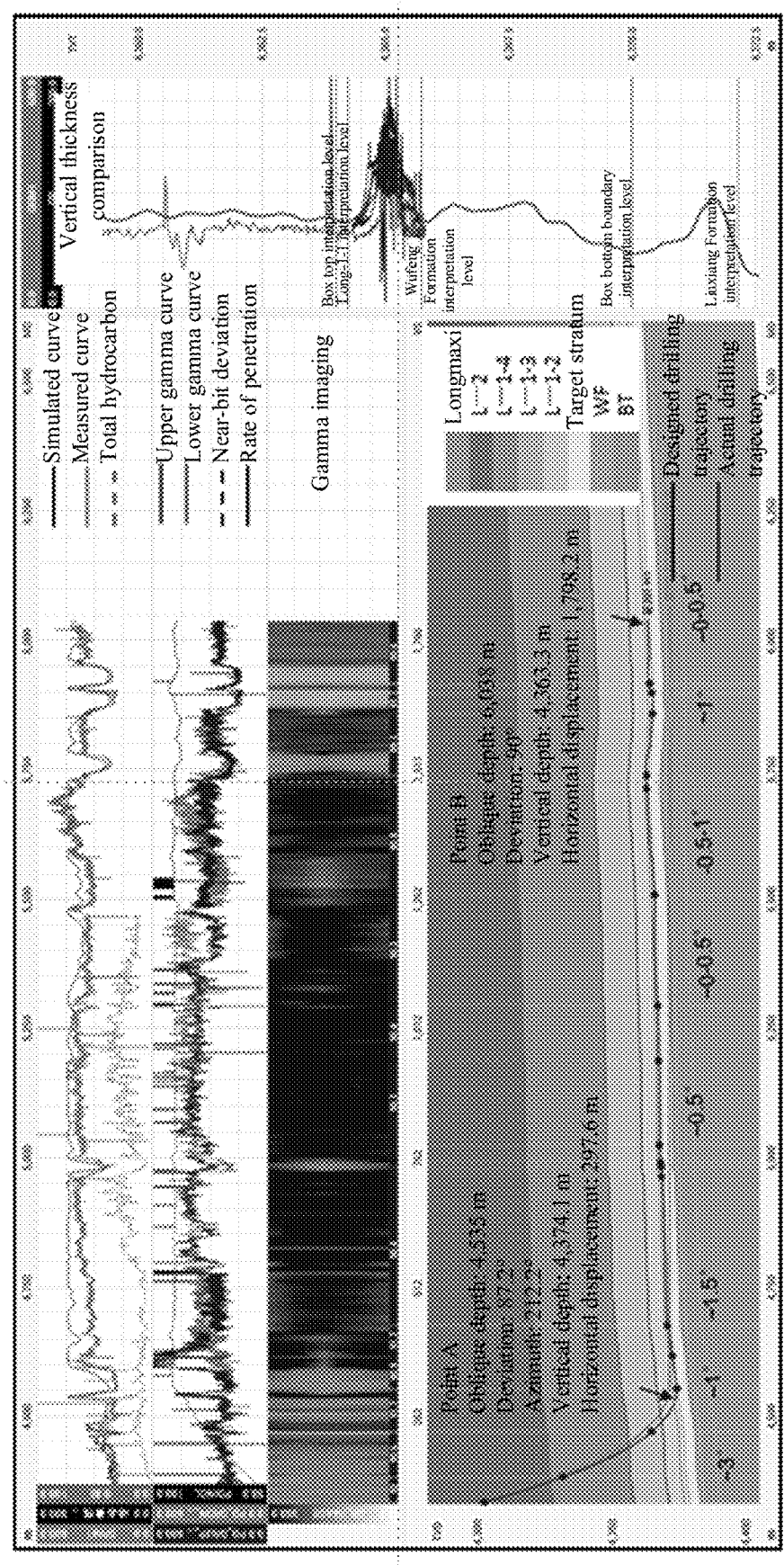
FIG. 4 is a structural diagram of a predicted acoustic LWD curve that is shifted, stretched or compressed according to an embodiment of the present disclosure.

The predicted acoustic LWD curve is shifted, stretched or compressed; a second correlation value between the predicted acoustic LWD curve and the acoustic LWD curve of the adjacent well is calculated in real time; and the predicted acoustic LWD curve is determined as an accurate predicted acoustic LWD curve when the second correlation value reaches a maximum value. The predicted acoustic LWD curve is shifted, stretched or compressed, as shown in FIG. 4.

Figure 5:
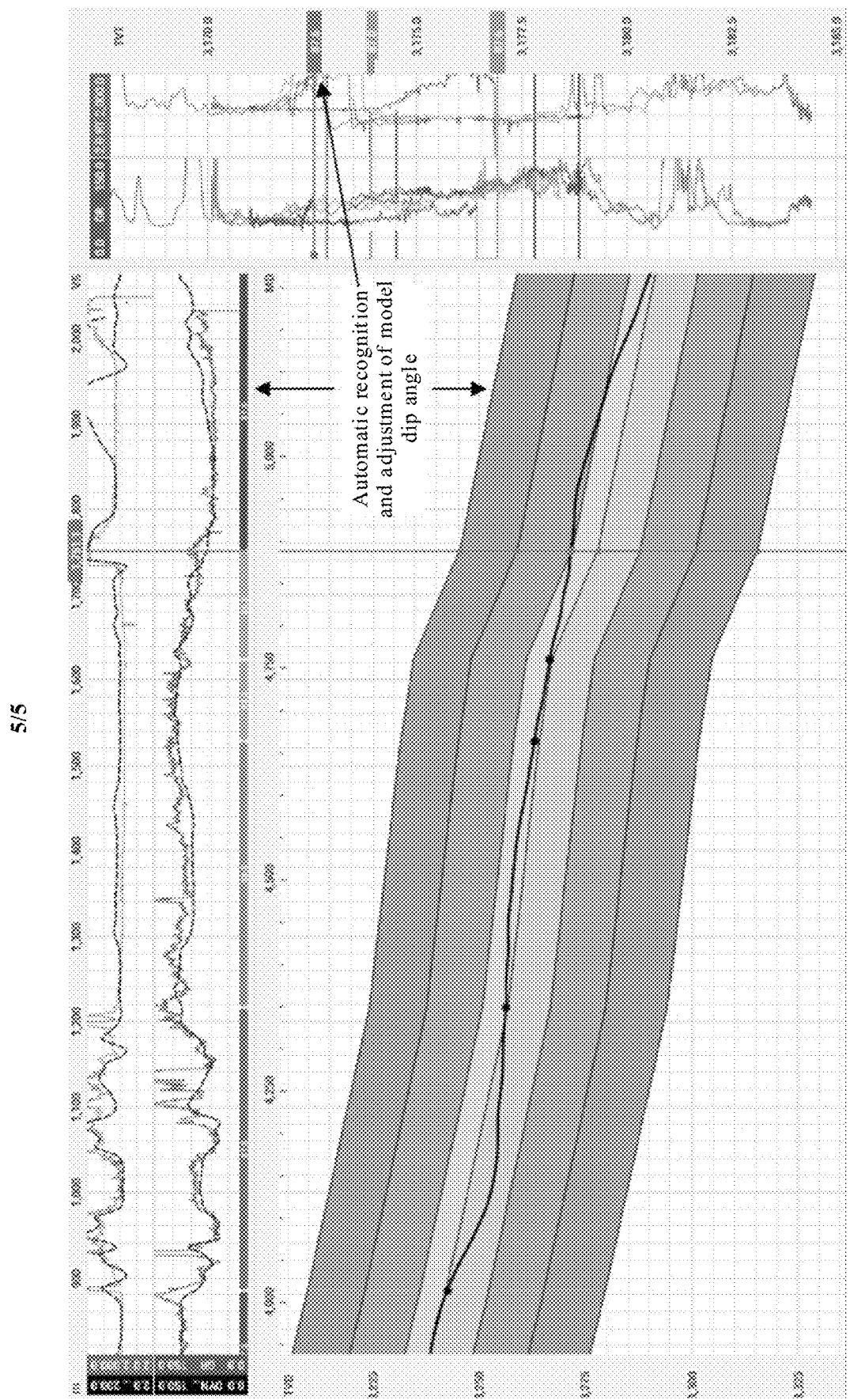
FIG. 5 is a structural diagram of the initial stratigraphic structure model corrected based on the predicted acoustic LWD curve according to an embodiment of the present disclosure.
Figure 6:
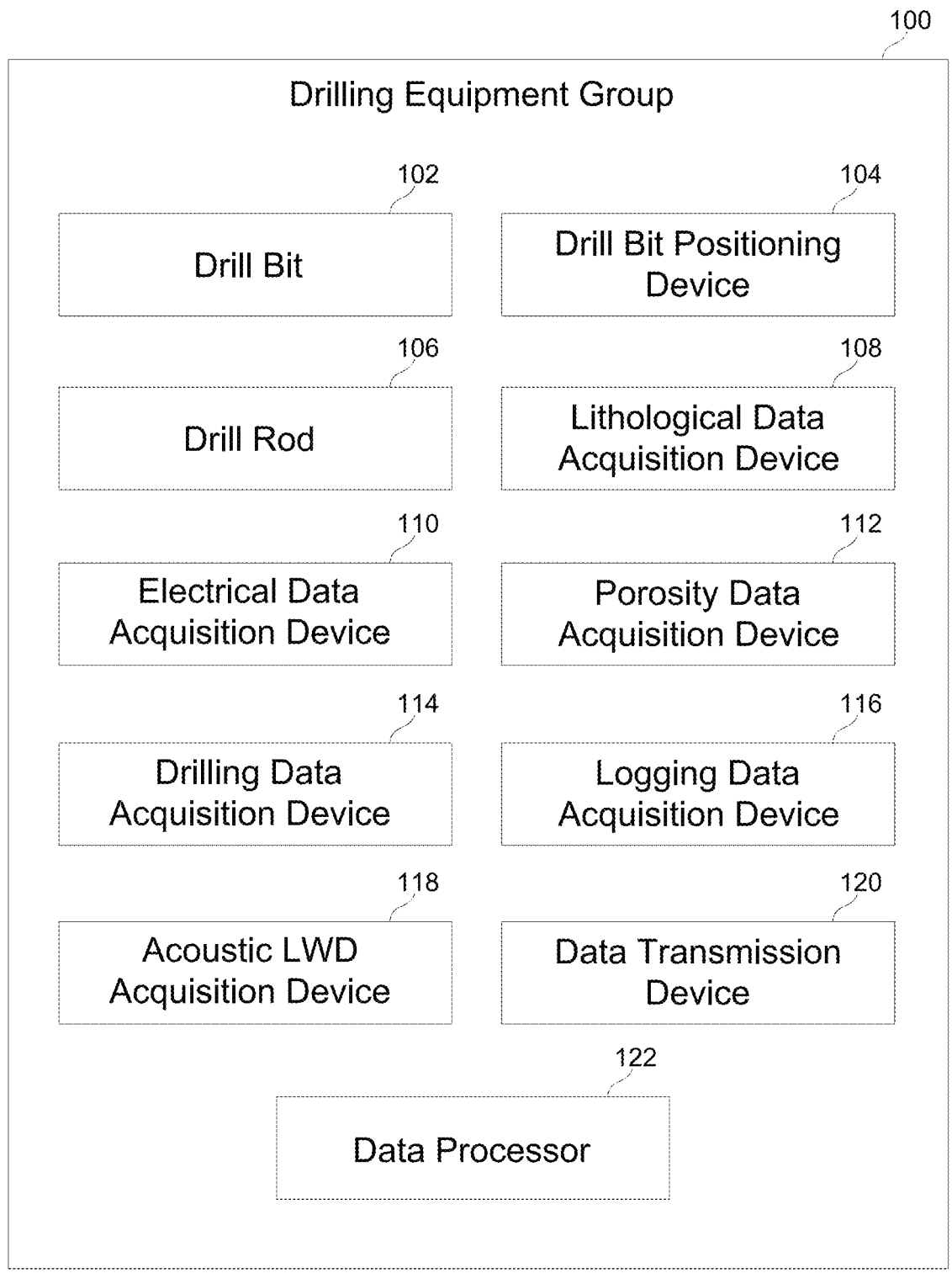
FIG. 6 is a diagram of a drilling equipment group.

The initial stratigraphic structure model is corrected based on the predicted acoustic LWD curve. The final corrected stratigraphic structure model is shown in FIG. 5.

The acoustic LWD curve of the reference well serves as the geological curve feature of the formation in the area. The predicted acoustic LWD curve is converted to a stratigraphic domain and fitted with the acoustic LWD curve of the reference well to acquire a relatively ideal model with relatively ideal horizontal dip angle, fault type and location. Finally, the trajectory is adjusted through the stratigraphic model.

The trajectory adjustment module is configured to generate a new drilling trajectory based on the stratigraphic structure model and the drilling trajectory of the target well location through the data processing device, and transmit the new drilling trajectory to the drill bit.

These steps are described in order in the above embodiments. However, those skilled in the art may understand that, in order to achieve the effects of these embodiments, different steps may not be necessarily executed in such an order, but may be executed simultaneously (in parallel) or in a reversed order. These simple changes should fall within the protection scope of the present disclosure.

Those skilled in the art should clearly understand that, for convenience and brevity of description, reference is made to corresponding processes in the above method embodiments for specific working processes and related description of the system, and details are not described herein again.

It should be noted that the precise deep oil and gas navigation system based on structural evaluation of a sand/shale formation in the above embodiments is only described by taking the division of the above functional modules as an example. In practical applications, the above functions can be completed by different functional modules as required, that is, the modules or steps in the embodiments of the present disclosure are further decomposed or combined. For example, the modules in the above embodiments may be combined into one module, or may be further divided into a plurality of sub-modules to complete all or part of the functions described above. The names of the modules and steps involved in the embodiments of the present disclosure are only for distinguishing each module or step, and should not be regarded as improper limitations on the present disclosure.

A second embodiment of the present disclosure provides an electronic device, including: at least one processor and a memory communicatively connected to the at least one processor, where the memory is configured to store an instruction executable by the processor; and the instruction is executed by the processor to implement a function of the above precise deep oil and gas navigation system based on structural evaluation of sand/shale formation.

A third embodiment of the present disclosure provides a computer-readable storage medium, configured to store a computer instruction, where the computer instruction is executed by a computer to implement a function of the above precise deep oil and gas navigation system based on structural evaluation of sand/shale formation.

Those skilled in the art should clearly understand that, for convenience and brevity of description, reference is made to corresponding processes in the above method embodiments for specific working processes and related description of the storage device and processing device, and details are not described herein again.

Those skilled in the art should be aware that the modules and method steps of the examples described in the embodiments disclosed herein may be implemented by electronic hardware, computer software or a combination thereof. The programs corresponding to software modules and method steps may be placed in random access memory (RAM), internal memory, read-only memory (ROM), electrically programmable ROM, electrically erasable programmable ROM, registers, hard disk, removable disk, compact disc read-only memory (CD-ROM), or in any other form of storage medium known in the technical field. In order to clearly illustrate the interchangeability of the electronic hardware and software, the composition and steps of each example are generally described in accordance with the function in the above description. Whether the functions are performed by electronic hardware or software depends on particular applications and design constraints of the technical solutions. Those skilled in the art may use different methods to implement the described functions for each specific application, but such implementation should not be considered to be beyond the scope of the present disclosure.

Terms such as "first" and "second" are intended to distinguish between similar objects, rather than describe or indicate a specific order or sequence.

Terms "include", "comprise" or any other variations thereof are intended to cover non-exclusive inclusions, so that a process, a method, an article, or a device/apparatus including a series of elements not only includes those elements, but also includes other elements that are not explicitly listed, or also includes inherent elements of the process, the method, the article or the device/apparatus.

The technical solutions of the present disclosure are described in the preferred implementations with reference to the drawings. Those skilled in the art should easily understand that the protection scope of the present disclosure is apparently not limited to these specific implementations. Those skilled in the art can make equivalent changes or substitutions to the relevant technical features without departing from the principles of the present disclosure, and the technical solutions derived by making these changes or substitutions should fall within the protection scope of the present disclosure.

What is claimed is:

1. A precise deep oil and gas navigation method based on structural evaluation of a sand/shale formation, wherein
the precise deep oil and gas navigation method is implemented through a drilling equipment group, wherein the drilling equipment group comprises a drill bit, a drill rod, a data transmitter, and a data processor; and the precise deep oil and gas navigation method comprises:
acquiring basic data of a target well location as well as basic data and an acoustic LWD curve of an adjacent well, and divide the basic data of the target well location and the basic data of the adjacent well into lithological group data, electrical group data, porosity group data, drilling group data, and logging group data through the data processor, wherein the lithological group data comprises: neutron logging (NEU), photoelectric factor (PEF), and gamma ray (GR); the electrical group data comprises: deep investigate double lateral resistivity log (RD), shallow investigate double lateral resistivity log (RS), and induction conductivity (COND); the porosity group data comprises: borehole diameter (CAL), compensated neutron log (CNL), and density (DEN); the drilling group data comprises drilling rate, rotary speed, and bit pressure; and the logging group data comprises C1C2, mud density in all (MDIA), and formation pore pressure graduation (FPPG); and
acquiring the basic data of the adjacent well; acquiring the acoustic LWD curve of the adjacent well, and uploading the acoustic LWD curve to the data processor through the data transmitter in the drill rod; and the data transmitter comprises an optical fiber and a data cable for wire or wireless communication;
generating a drilling trajectory of the target well location based on the basic data and the acoustic LWD curve of the adjacent well through the data processor, and transmitting the drilling trajectory to the drill bit through the data transmitter;
drilling, by the drill bit, according to the drilling trajectory,
acquiring the basic data of the target well location in real time and uploading the basic data to the data processor through the data transmitter in the drill rod;
calculating a first correlation value between each type of the basic data of the adjacent well and the acoustic LWD curve of the adjacent well, and eliminating a data type with the first correlation value lower than a preset first correlation threshold from the basic data of the target well location to acquire z non-redundant basic data groups, wherein z denotes an integer from 1 to 5;
performing dimensionality reduction on each of the non-redundant basic data groups to acquire z fusion feature parameters;
selecting fusion feature parameters of the lithological group data based on the basic data of the target well location, performing geological stratification to acquire a time-frequency spectrum of logging data, and converting the z fusion feature parameters into a three-dimensional fusion feature data volume based on the time-frequency spectrum of the logging data;
acquiring a predicted acoustic LWD curve based on the three-dimensional fusion feature data volume through a trained missing curve prediction model;
acquiring an initial stratigraphic structure model based on the basic data and the acoustic LWD curve of the adjacent well, and correcting the initial stratigraphic structure model based on the predicted acoustic LWD curve to acquire a stratigraphic structure model; and
generating a new drilling trajectory based on the stratigraphic structure model and the drilling trajectory of the target well location through the data processor, and transmit the new drilling trajectory to the drill bit,
drilling, by the drill bit, according to the new drilling trajectory.

2. The precise deep oil and gas navigation method based on the structural evaluation of the sand/shale formation according to claim 1, wherein before the basic data of the target well location and the basic data of the adjacent well are acquired, an outlier is removed by:
A10: arranging and combining acquired raw data to generate a to-be-processed dataset $X=\{x_1, \ldots, x_i, \ldots, x_n\}$, $1 \leq i \leq n$, $\forall x_i \in X$, $x_i=(x_{i1}, \ldots, x_{ig})$, wherein ξ denotes any integer from 1 to 15; $x_i$ denotes a data point; and i denotes a serial number of a data type;

A20: randomly selecting φ data points from the to-be-processed dataset X to form a to-be-processed data subset X' to be stored in a root node;

A30: randomly selecting a dimension q from the to-be-processed dataset X, and randomly generating a cutting point p in the dimension q, where the cutting point p satisfies $\min(x_{ij}, j=q, x_j \in X') < p < \max(x_{ij}, j=q, x_{ij} \in X')$, j denoting a serial number of the data point;

A40: generating a hyperplane based on the cutting point p to divide data in the dimension q into two subspaces, and storing a data point with a value less than p in the dimension q in a first leaf node and a data point with a value greater than or equal to p in the dimension q in a second leaf node;

A50: performing recursive processing according to steps A30 and A40 until all leaf nodes each comprise only one data point or an isolated tree reaches a preset height;

A60: repeating steps A30 to A50 until T isolated trees are generated, wherein the T isolated trees each exclude a leaf node or an external node, or comprise two leaf nodes $\{T_l, T_r\}$ and one internal node test; the internal node test comprises the dimension q and the cutting point p; and a point satisfying q<p belongs to $T_l$ while a point not satisfying q<p belongs to $T_r$;

A70: forming an isolated forest by the T isolated trees; letting each data point $x_i$ traverse each of the isolated trees; calculating a height $h(x_i)$ of the data point $x_i$ in each of the isolated trees, specifically, a number of edges that the data point $x_i$ passes through from the root node to the leaf node in each of the isolated trees; calculating an average height of the data point $x_i$ in the isolated forest; and normalizing the average height of each data point to acquire a normalized average height $\overline{h(x_i)}$ of the data point; and A80: calculating an outlier score s(x,φ) based on the normalized average height $\overline{h(x_i)}$ of the data point:

$$S(x, \varphi) = 2^{-\frac{E(\overline{h(x_i)})}{\overline{c(\varphi)}}};$$

wherein, $\overline{c(\varphi)}$ denotes an average value of a path length of a binary tree constructed by the φ data points, and E(*) denotes an expectation;

$$\overline{c(\phi)} = \begin{cases} 2H(\varphi - i) - \frac{2(\varphi - 1)}{\varphi}, & \varphi > 2 \\ 1, & \varphi = 2 \\ 0, & \varphi < 2 \end{cases};$$

wherein, H(i) denotes a harmonic number, estimated by ln(i)+0.5772156649; and 0.5772156649 denotes a Euler constant; and removing, when the outlier score s(x,φ) is less than a preset outlier threshold s, a corresponding data point to acquire effective logging data, $C=\{c_1, \ldots, c_\alpha, \ldots, c_m\}$, wherein $1 \leq \alpha \leq m$; $c_\alpha \in C$; and m denotes a number of data points of the effective logging data, and the effective logging data refers to the basic data of the target well location and the basic data of the adjacent well.

3. The precise deep oil and gas navigation method based on the structural evaluation of the sand/shale formation according to claim 2, wherein the operation of calculating the first correlation value between each type of the basic data of the adjacent well and the acoustic LWD curve of the adjacent well comprises:

calculating a Pearson correlation coefficient between each type of the basic data of the adjacent well and the acoustic LWD curve of the adjacent well as the first correlation value $S_{im1}$:

$$S_{im1} = \frac{\sum_{i=1}^{n}(C_i - \overline{C})(Y_i - \overline{Y})}{\sqrt{\sum_{i=1}^{n}(C_i - \overline{C})^2}\sqrt{\sum_{i=1}^{n}(Y_i - \overline{Y})^2}};$$

wherein, $C_i$ denotes a value of the acoustic LWD curve of the adjacent well at a data point i; $Y_i$ denotes a value of any type of the basic data of the adjacent well at the data point i; $\overline{C}$ denotes an average value of the acoustic LWD curve of the adjacent well; $\overline{Y}$ denotes an average value of any type of the basic data of the adjacent well; i denotes the serial number of the data point; and n denotes a number of data points.

4. The precise deep oil and gas navigation method based on the structural evaluation of the sand/shale formation according to claim 3, wherein the operation of performing the dimensionality reduction on each of the non-redundant basic data groups comprises:

performing, by a t-distributed stochastic neighbor embedding (t-SNE) method, nonlinear dimensionality reduction on the non-redundant basic data group of the lithological group data, the electrical group data, the porosity group data, the drilling group data, or the logging group data at the same group:

selecting, from the non-redundant basic data group $Y=\{y_1, \ldots, y_\alpha, \ldots, y_m\}$, any data points $y_\alpha$ and $y_\beta 1 \leq \alpha, \beta \leq m$, $y_\alpha, y_\beta \in Y$, where $y_\beta$ follows a Gaussian distribution $P_\alpha$ centered on $y_\alpha$ with a variance of $\sigma_\beta$, and $y_\alpha$ follows a Gaussian distribution $P_\beta$ centered on $y_\beta$ with a variance of $\sigma_\alpha$; and a conditional probability $P_{\beta|\alpha}$ for a similarity between the data points $y_\alpha$ and $y_\beta$ is:

$$P_{\beta|\alpha} = \frac{\exp(-\|y_\alpha - y_\beta\|^2/2\sigma_\alpha^2)}{\sum_{a \neq b}\exp(-\|y_a - y_b\|^2/2\sigma_\alpha^2)};$$

where, a perplexity Perp is specified by a user based on $\sigma_\alpha$, $\text{Perp}(P_\alpha)=2^{H(P_\alpha)}$, where $H(P_\alpha)$ denotes a Shannon information entropy of the Gaussian distribution $P_\alpha$:

$$H(P_\alpha) = -\sum_\beta P_{\beta|\alpha}\log_2 p_{\beta|\alpha};$$

the conditional probability for the similarity between the data points $y_\alpha$ and $y_\beta$ comprises a pairwise-similarity joint probability $P_{\alpha\beta}$ in all the data points:

$$p_{\alpha\beta} = \frac{p_{\beta|\alpha} + p_{\alpha|\beta}}{2m};$$

wherein, $p_{\alpha|\beta}$ denotes the conditional probability for the similarity between the data points $y_\beta$ and $y_\alpha$;

assuming that a dimensionality-reduced logging dataset constructed based on the effective logging data $Y=\{y_1, \ldots, y_\alpha, \ldots, y_m\}$ is $Z=\{z_1, \ldots, z_\alpha, \ldots, z_m\}$ and the effective logging data is in a high-dimensional space relative to the dimensionality-reduced logging dataset, then calculating a joint probability $q_{\alpha\beta}$ of simulated points $z_\alpha$ and $z_\beta$ corresponding to the data points $y_\alpha$ and $y_\beta$ in the dimensionality-reduced logging dataset:

$$q_{\alpha\beta} = \frac{(1+\|z_\alpha-z_\beta\|^2)^{-1}}{\sum_{\varepsilon1\neq\varepsilon2}(1+\|z_{\varepsilon1}-z_{\varepsilon2}\|^2)^{-1}};$$

wherein, $1 \leq \varepsilon1, \varepsilon2 \leq m$; $z_{\varepsilon1}$ and $z_{\varepsilon2}$ denote two different points in the dimensionality-reduced logging dataset, $z_{\varepsilon1}, z_{\varepsilon2} \in Z$; the calculation of each joint probability $q_{\alpha\beta}$ traverses every two different points in the dimensionality-reduced logging dataset;

measuring, based on the pairwise-similarity joint probability $P_{\alpha\beta}$ of the conditional probability for the similarity between the data points $y_\alpha$ and $y_\beta$ in all the data points and the joint probability $q_{\alpha\beta}$ of the simulated points $Z_\alpha$ and $Z_\beta$ corresponding to the data points $y_\alpha$ and $y_\beta$ in the dimensionality-reduced logging dataset, a third similarity value $S_{im3}$ between a probability distribution $Q$ of the dimensionality-reduced logging dataset and a high-dimensional spatial probability distribution $P$ of the effective logging data through a Kullback-Leibler (KL) divergence:

$$S_{im3} = KL(P\|Q) = \sum_\alpha \sum_\beta p_{\alpha\beta} \log \frac{p_{\alpha\beta}}{q_{\alpha\beta}};$$

where, a smaller third similarity value C indicates a higher simulation accuracy of the simulated points in the dimensionality-reduced logging dataset;

minimizing the KL divergence through a gradient descent method:

$$\frac{\delta S_{im3}}{\delta z_\alpha} = 4\sum_\beta (p_{\alpha\beta}-q_{\alpha\beta})(z_\alpha-z_\beta)(1+\|z_\alpha-z_\beta\|^2)^{-1};$$

acquiring the dimensionality-reduced logging dataset $Z=\{z_1, \ldots, z_\alpha, \ldots, z_m\}$; and retaining a first dimension of the dimensionality-reduced logging dataset and deleting remaining dimensions thereof to acquire dimensionality-reduced feature parameters $\hat{Z}=\{\hat{z}_1, \ldots, \hat{z}_\alpha, \ldots, \hat{z}_m\}$; and selecting a dimensionality-reduced feature parameter of one dimension for explaining most content.

5. The precise deep oil and gas navigation method based on the structural evaluation of the sand/shale formation according to claim 1, wherein the time-frequency spectrum of the logging data is calculated as follows:

setting 10 data points as one depth unit based on the lithological group data of the basic data of the target well location;

calculating an average value $\bar{x}_{lit}$ of the lithological group data of each depth unit:

$$\bar{x}_{lit} = \frac{x_{g1}+x_{g2}+\ldots+x_{g10}}{10};$$

wherein, g denotes a group number;

calculating a difference between the average values $\bar{x}_{lit}$ of the lithological group data of each two adjacent depth units:

$$d_u = \bar{x}_{lit(u+1)} - \bar{x}_{lit(u)}$$

setting, if $d_e > 10$, a lower depth unit of the two adjacent depth units as a lithological abrupt position, and calculating a number $h_t$ of depth units between each two abrupt positions to represent a formation thickness, where u denotes a serial number of the depth unit;

forming a frequency unit by $h_t$ data points of fusion feature parameters, and calculating a frequency domain value of each frequency unit:

$$X[f] = \sum x_{\gamma g k} e^{-j\left(\frac{2\pi}{10}\right)fk};$$

forming a $h_t \times 10$ time-frequency spectrum by values with frequencies f of 5, 10, 15, 20, 25, 30, 35, 40, 45, and 50, together with the $h_t$ data points, where k denotes a serial number ranging from 1 to 10 for an intra-group data point, and $\gamma$ denotes a serial number ranging from 1 to z for the fusion feature parameters; and connecting the $h_t \times 10$ time-frequency spectrum to z fusion feature parameters to acquire the three-dimensional fusion feature data volume $h_t \times 10 \times z$.

6. The precise deep oil and gas navigation method based on the structural evaluation of the sand/shale formation according to claim 1, wherein the operation of acquiring the predicted acoustic LWD curve through the trained missing curve prediction model comprises:

training the missing curve prediction model comprising a t-channel image recognition network with 2t convolutional layers and 2t average pooling layers, wherein each channel comprises a first convolutional layer, a first average pooling layer, a second convolutional layer, and a second average pooling layer that are sequentially connected; each convolutional layer has a different size; an f-th channel comprises a $(4*f-1)*(4*f-1)$ first convolutional layer, a $(4*f+4)*(4*f+4)$ second convolutional layer, and $2*2$ pooling layers; and all the channels are connected together to one fully connected layer and one naive Bayesian decision maker;

a first convolutional layer of a first channel, a first convolutional layer of a second channel, and a first convolutional layer of a third channel are denoted as C1, C3, and C5 layers, respectively, the C1 layer is configured to convolve an input image through 8 $h_t \times h_t \times h_t$ convolution kernels; the C3 layer is configured to convolve an input image through 8 $3h_t \times 3h_t \times 3h_t$ convolution kernels; and the C5 layer is configured to convolve an input image through 8 $5h_t \times 5h_t \times 5h_t$ convolution kernels;

$$con_{p,q}^l = \sum_{m1=1}^{L} \sum_{m2=1}^{W} CON_{m1,m2}^{l-1} \times ker_{p,q}^l + b_{p,q}^l;$$

wherein, $con_{p,q}^{l}$ denotes a convolution result at a position (p, q); l denotes a current layer number; CON denotes a matrix covered by the convolution kernels; L and W denote a length and a width of the matrix covered by the convolution kernels; m1 and m2 respectively denote a serial number of a length of the convolution kernel and a serial number of a width of the convolution kernel, ranging from 1 to L; ker denotes a kernel function; and b denotes a corresponding bias term;

fitting the convolution result by a rectified linear unit (ReLU) function to acquire a fitted convolution result;

performing upsampling pooling on the fitted convolution result:

$$con_{m3,m4}^{l}=\max(CON_{m1,m2}^{l-1});$$

wherein, $con_{m3,m4}^{l}$ denotes a two-dimensional matrix representation of a pooled convolution result; and m3, m4 denotes a convolution result at a position (m3, m4);

converting the pooled convolution result into a flattened one-dimensional feature vector through a flattened layer;

integrating the flattened one-dimensional feature vector through the fully connected layer:

$$con_{key}^{l} = \sum_{r=1}^{R} con_{r}^{key-1} \cdot w_{r}^{l} + b_{r}^{l};$$

wherein, $con_{i}^{l}$ denotes a one-dimensional matrix representation for features after the integration by the fully connected layer; l denotes the current layer number; key denotes an index value of a one-dimensional matrix; R denotes a length of a feature vector in an (l−1)-th layer; w denotes a weight matrix; b denotes the bias term; and r denotes a serial number of a data point of the feature vector;

introducing the naive Bayesian decision maker into the fully connected layer; and taking the integrated flattened one-dimensional feature vector as the predicted acoustic LWD curve.

7. The precise deep oil and gas navigation method based on the structural evaluation of the sand/shale formation according to claim 1, wherein the operation of correcting the initial stratigraphic structure model based on the predicted acoustic LWD curve to acquire the stratigraphic structure model comprises:

shifting, stretching or compressing the predicted acoustic LWD curve; calculating a second correlation value between the predicted acoustic LWD curve and the acoustic LWD curve of the adjacent well in real time; and determining the predicted acoustic LWD curve as an accurate predicted acoustic LWD curve when the second correlation value reaches a maximum value; and correcting the initial stratigraphic structure model based on the predicted acoustic LWD curve.

* * * * *